(12) United States Patent
Krieg et al.

(10) Patent No.: US 7,323,874 B2
(45) Date of Patent: Jan. 29, 2008

(54) COMBINED POSITRON EMISSION TOMOGRAPHY AND MAGNETIC RESONANCE TOMOGRAPHY UNIT

(75) Inventors: Robert Krieg, Nuremberg (DE); Rainer Kuth, Herzogenaurach (DE); Ralf Ladebeck, Erlangen (DE); Ralph Oppelt, Uttenreuth (DE); Wolfgang Renz, Erlangen (DE); Sebastian Schmidt, Erlangen (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/395,251

(22) Filed: Apr. 3, 2006

(65) Prior Publication Data
US 2006/0250133 A1 Nov. 9, 2006

(30) Foreign Application Priority Data
Apr. 1, 2005 (DE) ...................... 10 2005 015 071

(51) Int. Cl.
*G01V 3/00* (2006.01)
(52) U.S. Cl. ...................... 324/318; 600/411
(58) Field of Classification Search ................ 324/318, 324/322, 300; 600/411
See application file for complete search history.

(56) References Cited
U.S. PATENT DOCUMENTS
4,825,163 A 4/1989 Yabusaki et al.

4,939,464 A * 7/1990 Hammer ...................... 324/318
6,946,841 B2 * 9/2005 Rubashov ................... 324/318
2005/0113667 A1 * 5/2005 Schlyer et al. .............. 600/411

FOREIGN PATENT DOCUMENTS
DE 44 14 371 C2 10/1997

OTHER PUBLICATIONS
Schlyer et al., "Development of a Simultaneous PET/MRI Scanner", Nuclear Science Symposium Conference Record, vol. 6, 2004, pp. 3419-3421.

* cited by examiner

Primary Examiner—Louis M. Arana
(74) Attorney, Agent, or Firm—Staas & Halsey LLP

(57) ABSTRACT

A positron emission tomography unit (PET), having a unit part assigned to an examination space and a first evaluation unit, is combined with a magnetic resonance tomography unit (MRT). The unit part of the PRT includes at least two gamma ray detector units with in each case an assigned electronics unit. The MRT includes a second evaluation unit, a gradient coil system and a high frequency antenna device formed as a stripline antenna device having at least two conductors. The high frequency antenna device is arranged nearer to the examination space than the gradient coil system with a high frequency shield between the gradient coil system and the high frequency antenna device. Each conductor of the stripline antenna device respectively includes a gamma ray detector unit with an assigned electronics unit. The conductors of the stripline antenna device are configured for the respective gamma ray detector units and their assigned electronics units as shielding covers that are caused by the high frequency antenna device and are opaque to high frequency radiation. An examination object in the examination space can be imaged by the combined positron emission tomography and magnetic resonance tomography unit.

11 Claims, 3 Drawing Sheets

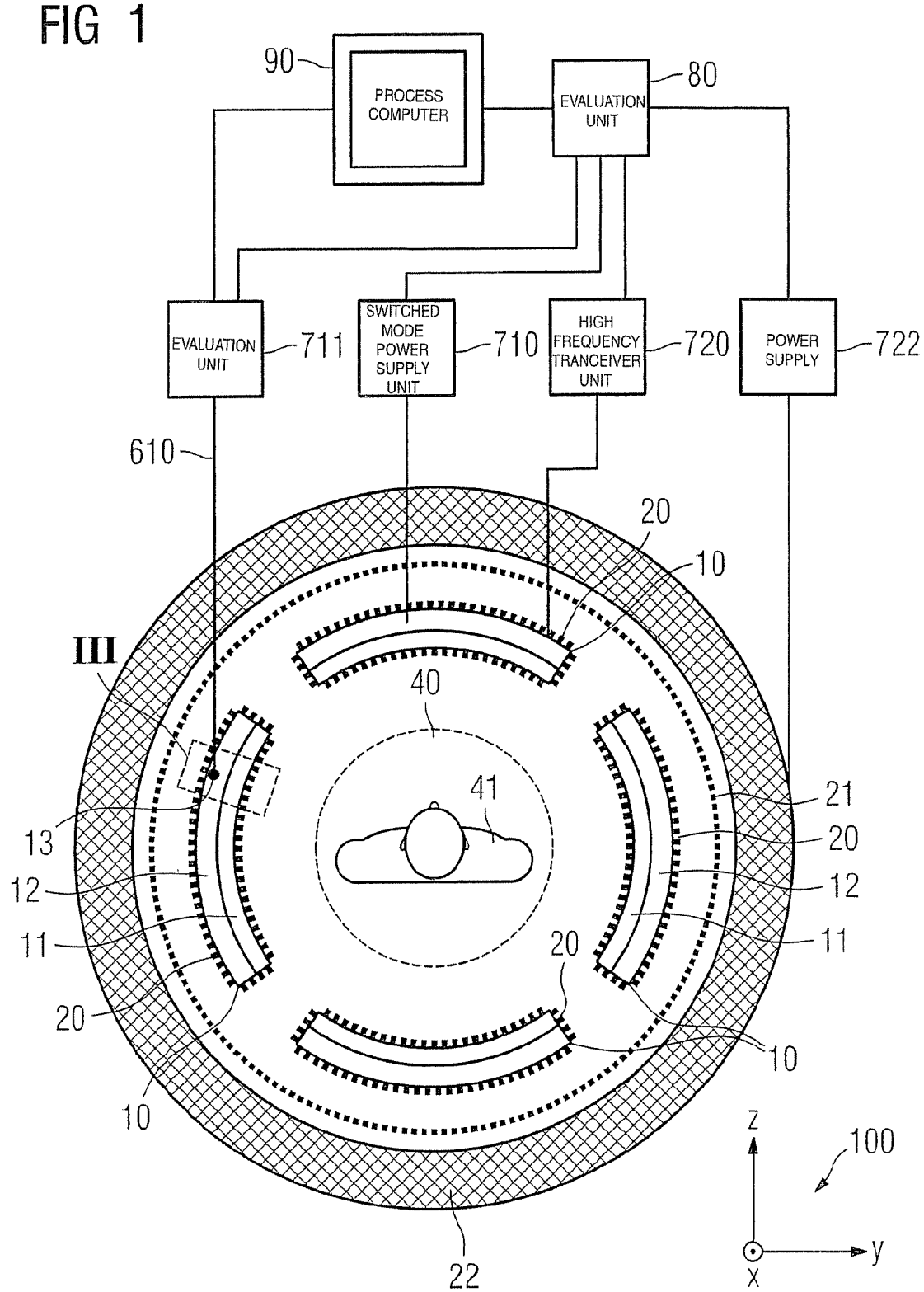

COMBINED POSITRON EMISSION TOMOGRAPHY AND MAGNETIC RESONANCE TOMOGRAPHY UNIT

CROSS REFERENCE TO RELATED APPLICATIONS

This application is based on and hereby claims priority to German Application No. 10 2005 015 071.3 filed on Apr. 1, 2005, the contents of which are hereby incorporated by reference.

BACKGROUND OF THE INVENTION

1. Field of the Invention

The invention relates to a combination of positron emission tomography and magnetic resonance tomography units (PET/MRT unit) for imaging an examination object in an examination space. The invention also relates to a method for imaging an examination object in an examination space by a combined positron emission tomography and magnetic resonance tomography unit.

2. Description of the Related Art

Magnetic resonance tomography (MRT) and positron emission tomography (PET) are nowadays indispensable methods for the accurate diagnosis of many diseases and medical disturbances. It is possible hereby to image affected organs and organ parts exactly in three dimensions and, moreover, to track the physiological and biochemical processes in the affected organs or organ parts down to a molecular plane.

The strength of MRT resides in the ability to image many organs exactly with a very high degree of spatial resolution. By comparison with computed tomography (CT), this method manages here without potentially injurious ionizing radiation. By contrast, the strengths of PET reside chiefly in the functional imaging, that is to say in the imaging of biochemical and physiological processes. However, PET has a comparatively poor spatial resolution of, for example, approximately 5 mm that can no longer be raised without additional radiation loading. By combining the two methods, it is possible to use both the high spatial resolution of MRT and the functional information from PET toward an even more exact diagnosis.

Combined CT and PET measurements are already known to the specialists in the field. In this case, a patient is conveyed directly in sequence through the detector ring of a CT unit and the detector ring of a PET unit. The resulting images are merged in a computer. Similar considerations apply to positron emission tomography and magnetic resonance tomography. In this case, for example, a PET unit can be arranged directly downstream of an MRT unit. The PET is therefore performed after the MRT. Thus, the patient is conveyed, for example, on a couch, from the MRT unit to the PET unit. The two units are consequently separated from one another in space, and the two imaging methods therefore take place independently of one another, consecutively in time.

A diagnostic MRT unit with an examination space is disclosed in DE 44 14 371 C2. The MRT unit includes a high frequency antenna device and a gradient coil system, the high frequency antenna device being arranged nearer to the examination space than the gradient coil system. A high frequency shield in the shape of the lateral surface of a cylinder is arranged in this case between the gradient coil system and high frequency antenna device.

U.S. Pat. No. 4,825,163 specifies exemplary embodiments of high frequency antenna devices for MRT units which are easy to adjust for the generation of a homogeneous magnetic field. Such high frequency antenna devices are also termed stripline antenna devices among experts.

SUMMARY OF THE INVENTION

It is an aspect of the invention to specify a combination of a positron emission tomography unit and a magnetic resonance tomography unit that saves space and in which the PET and MRT imaging do not interfere with one another.

It is a further aspect of the invention to specify a method that saves time and in which the PET and MRT imaging do not interfere with one another.

A combined PET/MRT unit for imaging an examination object in an examination space according to this aspect of the invention includes a PET unit and an MRT unit. The PET includes a unit part assigned to the examination space and a first evaluation unit for evaluating the electric signals for a PET image of the examination object. The unit part has at least two gamma ray detector units with in each case an assigned electronics unit for detecting radiation emitted from the examination space of the examination object and converting the radiation into corresponding electric signals. The MRT unit includes a high frequency antenna device for transmitting high frequency excitation pulses into the examination space and/or for receiving from the examination space magnetic resonance signals from the examination object, the high frequency antenna device being formed as a stripline antenna device having at least two conductors; a gradient coil system for generating magnetic gradient fields in the examination space, the high frequency antenna device being arranged nearer to the examination space than the gradient coil system; a high frequency shield arranged between the gradient coil system and the high frequency antenna device, for decoupling the high frequency antenna device from the gradient coil system; and a second evaluation unit for evaluating the magnetic resonance signals for an MRT image of the examination object. Each conductor of the stripline antenna device respectively includes a gamma ray detector unit with an assigned electronics unit in each case. The conductors of the stripline antenna device are configured for the respective gamma ray detector units and their assigned electronics units as shielding covers that are caused by the high frequency antenna device and are opaque to high frequency radiation.

By integrating the PET unit part in the MRT unit, it is possible to specify according to an aspect of the invention a combined PET/MRT unit that corresponds in terms of dimension approximately to a single MRT unit. Use is made here of the property that the high frequency antenna device is virtually transparent to the PET radiation and therefore passes to the gamma ray detector of the PET unit part virtually without losses. Furthermore, as a result of the conductors of the stripline antenna device which are formed as a shielding cover, on the one hand virtually no high frequency radiation emanating from the high frequency antenna device reaches the gamma ray detector of the PET unit part, and on the other hand virtually no high frequency interfering radiation emanating from the PET unit part passes in the direction of the examination space. However, the conductors of the stripline antenna device are designed to be transparent to the gradient fields, and so a reliable MRT mode is ensured for the unit according to this aspect of the invention.

It is particularly advantageous when each conductor of the stripline antenna device has a first, and arranged opposite thereto, a second electrically conductive layer arrangement, the layer arrangements are separated from one another by a dielectric, the layer arrangements have conductor tracks that are arranged next to one another and are separated by electrically insulating slots, the slots in the first layer arrangement are arranged offset from the slots in the second layer arrangement, and neighboring conductor tracks are interconnected via bridges conducting high frequency currents. Here, currents induced in the conductors of the stripline antenna device by the high frequency antenna device can flow between adjacent conductor tracks essentially via the bridges, it being impossible, given a suitable arrangement of the bridges, to induce ring currents, originating from the gradient fields, via a number of conductor tracks, or to induce currents whose resonance frequency is in the region of the operating frequency of the MRT unit. On the other hand, there is essentially no impairment by the bridges of the ability of the gradient fields of the gradient coil system to permeate the conductors of the stripline antenna device.

It is advantageous in this case when at least a portion of the bridges is formed by pieces of metal foil. It is thereby possible to shape and adapt the conductors of the stripline antenna device flexibly starting from a slotted basic design.

It is advantageous, furthermore, when at least a portion of the bridges is formed by capacitors. The capacitor design is selected in this case such that they have a large impedance for the operating frequency of the gradient coil system, while their impedance is negligible for operating frequencies of the high frequency antenna device. It is possible thereby to avoid closed circuits in the conductors of the stripline antenna device that are induced by gradient fields and can be formed over a number of conductor tracks.

It is possible with particular advantage for the first evaluation unit to be connected to the electronics units of the PET unit part via at least one signal line running inside and outside the PET unit part, and for a part of the signal line that runs inside the PET unit part to be provided in each case with a filter which is assigned to the corresponding electronics unit, in particular a bandpass filter or else a cascade of a high-pass filter and a notch filter. It is necessary in this case with reference to the bandpass filter to select the lower cutoff frequency such that the strong low-frequency gradient signals cannot pass via the signal line into the PET unit part shielded against high frequency radiation. However, a sufficiently deep spectral component of the PET signal should be able to pass outward to the first evaluation unit. The upper limit of the bandpass filter is to be selected such that the higher frequency spectral components of the PET signals precisely do not yet interfere with the high frequency signals of the MRT unit. Use is made for the configuration with the cascade of a high-pass filter and a notch filter of the fact that the high frequency signals of the MRT unit are of a very narrowband nature with a bandwidths of, for example, 0.5 MHz and a center frequency of 64 MHz. Here, the notch filter is to be tuned accurately to the frequencies of the high frequency signals of the MRT unit. The cutoff frequency of the high-pass filter is, in addition, to be selected such that the strong low frequency gradient signals cannot pass via the signal line into the PET unit part shielded against high frequency radiation, it being required that a sufficiently deep spectral component of the PET signals be able to pass outward to the first evaluation unit.

It is particularly favorable when all the components of the positron emission tomography unit part are made from nonmagnetic material. Inhomogeneities in the magnetic field inside the combined PET/MRT unit and, in particular, inside the examination space are thereby avoided.

It is particularly advantageous when the electronics units of the PET unit part are in each case provided with at least one protection diode. The at least one protection diode assigned to an electronics unit thereby saves the respective electronics unit, in particular, from being destroyed by the excitation pulses emitted by the high frequency antenna device of the MRT unit, which can have high, destructive field strengths.

According to another aspect of the invention, a method for imaging an examination object in an examination space by a combined PET/MRT unit. The PET includes a unit part that is assigned to the examination space and has at least two gamma ray detector units with in each case an assigned electronics unit, the detector units detecting radiation emitted from the examination space by the examination object, and the electronics units converting the detected radiation into corresponding electric signals, and a first evaluation unit that evaluates the electric signals for a PET image of the examination object. The MRT includes a high frequency antenna device that transmits excitation pulses into the examination space and/or receives from the examination space magnetic resonance signals from the examination object, the high frequency antenna device (20) being formed as a stripline antenna device having at least two conductors; a gradient coil system that generates magnetic gradient fields in the examination space, the high frequency antenna device being arranged nearer to the examination space than the gradient coil system; a high frequency shield that is arranged between the gradient coil system and the high frequency antenna device and decouples the high frequency antenna device from the gradient coil system; and a second evaluation unit that evaluates the magnetic resonance signals for an MRT image of the examination object.

According to this aspect of the invention, the first evaluation unit does not evaluate electric signals for a PET image of the examination object at least for the duration of each excitation pulse emitted by the high frequency antenna device. Furthermore, each conductor of the stripline antenna device respectively includes a gamma ray detector unit with an assigned electronics unit in each case and the conductors of the stripline antenna device are configured for the respective gamma ray detector units and their assigned electronics units as shielding covers that are caused by the high frequency antenna device and are opaque to high frequency radiation.

The fact that the first evaluation unit does not evaluate measured PET signals at least for the duration of each excitation pulse emitted by the high frequency antenna device ensures that the signals received by the evaluation unit also actually stem from PET radiation and not from high frequency interfering radiation emanating from the high frequency antenna device of the MRT unit. This ensures a reliable PET mode of the unit according to this aspect of the invention. Moreover, the same advantages are afforded for a method according to the invention as for a PET/MRT unit according to the invention.

It is particularly advantageous when the electronics unit of the PET unit part is not supplied with energy for the duration of each excitation pulse emitted by the high frequency antenna device. It is thereby possible to achieve a reduction in the power loss of the PET unit part.

It is, moreover, also advantageous when the electronics units of the PET unit part are switched into a standby mode for the duration of each excitation pulse emitted by the high frequency antenna device. In the standby mode, that is to say in the energy saving mode of readiness, a reduction in the power loss of the PET unit part can be achieved, on the one hand, and the PET unit part can, on the other hand, respond quickly and switch into recording mode without a great delay.

BRIEF DESCRIPTION OF THE DRAWINGS

These and other objects and advantages of the present invention will become more apparent and more readily appreciated from the following description of the preferred, but by no means restrictive, exemplary embodiments, taken in conjunction with the accompanying drawings which, for the sake of illustration, are not to scale, and certain features are illustrated schematically, where FIG. 1 is a schematic of a combined positron emission tomography and magnetic resonance tomography unit.

Figure 2A:
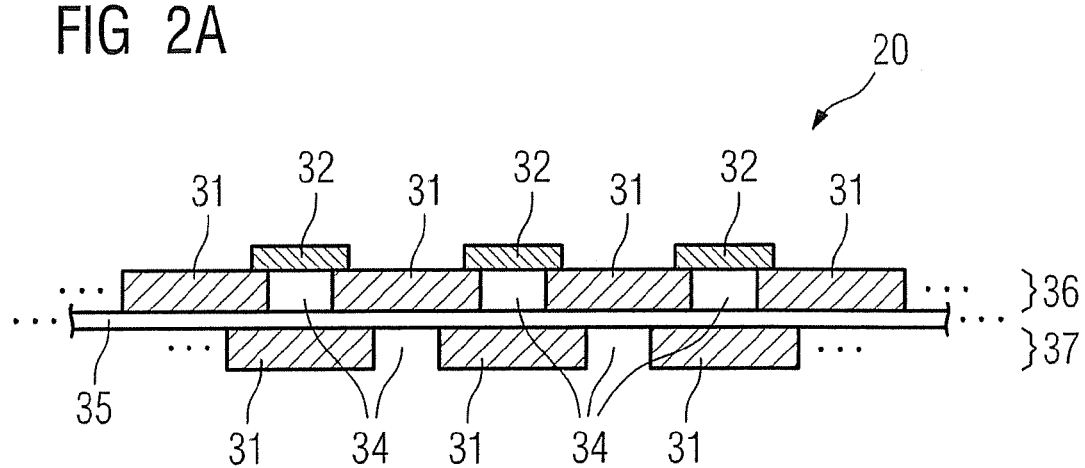
FIG. 2A is a cross section of a conductor of the stripline antenna device with bridges made from pieces of metal foil.

DETAILED DESCRIPTION OF THE
PREFERRED EMBODIMENT

Reference will now be made in detail to the preferred embodiments of the present invention, examples of which are illustrated in the accompanying drawings, wherein like reference numerals refer to like elements throughout.

FIG. 1 is a schematic of a cross section of a combined PET/MRT unit for imaging an examination object 41 in an examination space 40. The combined PET/MRT unit is composed of an MRT unit and a PET unit with an integrated PET unit part 10.

For the sake of clarity, the obligatory coils in an MRT unit, which generate a fundamental magnetic field in the examination space 40 are not illustrated. In order to generate independent, mutually perpendicular magnetic field gradients of directions x, y, z in accordance with a coordinate system 100, an MRT unit includes a gradient coil system 22, which is illustrated here only in a simplified schematic fashion. In addition, the MRT unit is assigned a high frequency antenna device 20 for generating excitation pulses in the examination space 40, and/or for receiving magnetic resonance signals from the examination object 41 from the examination space 40. The embodiment of the high frequency antenna device 20 that is illustrated here is formed from a number of planar conductors curved around the examination space 40. Such a high frequency antenna device 20 is also denoted as a stripline antenna device. Four conductors of a stripline antenna device 20 are indicated in FIG. 1 as an example. Furthermore, a high frequency shield 21 in the shape of the lateral surface of a cylinder and intended, in particular, for the electromagnetic decoupling of the high frequency antenna device 20 from the gradient coil system 22 is indicated between the gradient coil system 22 and high frequency antenna device 20. The high frequency shield 21 is designed in such a way that it is transparent in the low frequency region for the signals generated by the gradient coil system 22, and is opaque in the high frequency region to the signals generated by the high frequency antenna device 20.

In this exemplary embodiment the PET unit part 10 includes four gamma ray detectors 11 with the aid of which the PET radiation emitted by the examination object 41 can be detected, and a corresponding electric signal can be generated with the aid of electronics units 12 assigned to the gamma ray detectors 11. A multiplicity of scintillation detectors facing the examination space 40, for example, can be used as gamma ray detector 11.

The individual gamma ray detectors 11 with assigned electronics units 12 are arranged here in each case inside the conductors of the stripline antenna device 20. The conductors are widened for this purpose to a certain volume.

The conductors of the stripline antenna device 20 are designed in such a way that virtually no high frequency radiation can penetrate them. The conductors are, however, of transparent design with reference to the gradient fields.

The electric PET signals pass to an evaluation unit 711 that is connected via a signal line 610 to a connection 13 of the PET unit part 10. The evaluation unit 711 has a process computer with the aid of which PET images are obtained from the electric PET signals. The supply of energy to the PET unit part 10 is ensured by a switched-mode power supply unit 710 that is connected to the PET unit part 10, in particular to the electronics unit 12 of the PET unit part 10. The detail denoted by III emerges more clearly from FIG. 3. The individual gamma ray detectors 11 with their assigned electronics units 12 are interconnected in such a way that they have a common connection 13 for the evaluation unit 711. The gamma ray detectors 11 and the assigned electronics units 12 are likewise supplied with energy via a single connection to the switched-mode power supply unit 710. For the sake of clarity, the interconnections between the gamma ray detectors 11 and assigned electronics units 12 are not depicted in FIG. 1. It is also conceivable that each gamma ray detector 11 with assigned electronics unit 12 is solely connected per se to the evaluation unit 711, and that each gamma ray detector 11 with assigned electronics unit 12 is individually supplied with energy by the switched-mode power supply unit 710.

The MRT unit is operated via a further evaluation unit 80, likewise having a process computer. The high frequency antenna device 20 is connected to the evaluation unit 80 via a high frequency transceiver unit 720. Under the control of the evaluation unit 80, it is in this case excited by the transceiver unit 720 to emit excitation pulses. Magnetic resonance signals received thereupon from the high frequency antenna device 20 are then transmitted to the evaluation unit 80 in turn via the transceiver unit 720, if appropriate in a fashion amplified by an amplifier integrated in the transceiver unit 720. The evaluation unit 80 then obtains an MRT image from the magnetic resonance signal.

In accordance with the exemplary embodiment in FIG. 1, the gradient coil system 22 is supplied with current, likewise under the control of the evaluation unit 80, with the aid of a power supply 722 connected to the gradient coil system 22. There is also a connection between the first evaluation unit 711 assigned to the PET unit part 10 and the second evaluation unit 80, assigned to the MRT unit, via which the first evaluation unit 711 receives signals transmitted by the second evaluation unit 80 and which interrupt the evaluation in the first evaluation unit 711 over the duration of an excitation pulse. So that, if appropriate, the switched-mode power supply unit 710, which in particular supplies energy to the electronics unit 12 of the PET unit part 10, can, moreover, likewise be driven depending on how the MRT unit is driven, it is itself also connected to the evaluation unit 80.

The PET and MRT tomograms obtained with the aid of the evaluation units 711 and 80 are transmitted to a process computer 90 that preferably has a display screen output by which the tomograms can be superimposed by computation and output as a combined PET/MRT image.

A part of the conductor of the stripline antenna device 20 is illustrated in cross section in FIG. 2A. The conductor of the stripline antenna device 20 includes two metallic layer arrangements 36 and 37, in particular made from copper, that are respectively configured from conductor tracks 31 arranged next to one another. The conductor tracks 31 are separated in this case by electrically insulating slots 34. The two layer arrangements 36 and 37 are applied to a dielectric 35 arranged between the layer arrangements, in particular one made from epoxy or Teflon material reinforced with glass fiber fabric. Here, the two layer arrangements 36 and 37 are arranged relative to one another in such a way that their conductor tracks 31 and slots 34 are arranged in an offset fashion.

Figure 2B:
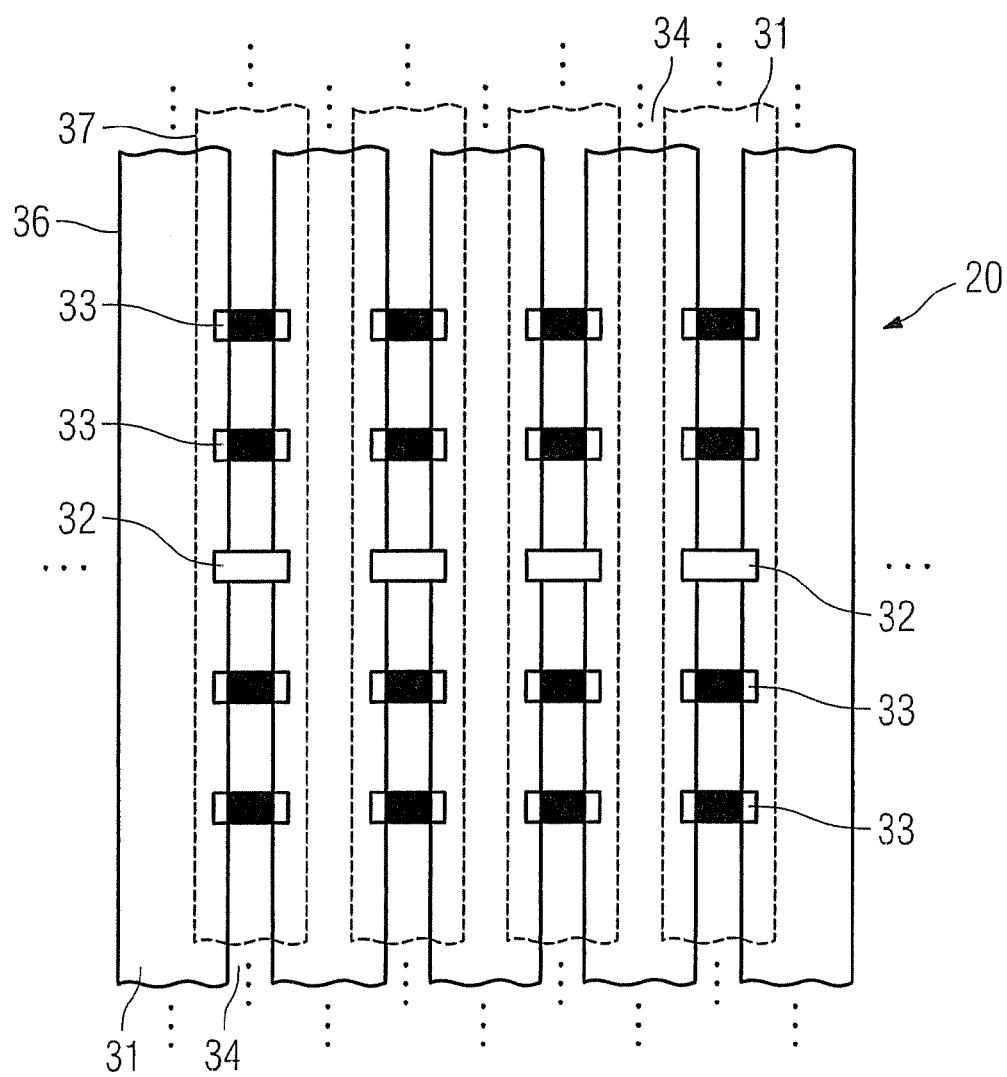
FIG. 2B is a plan view of a detail of the conductor of the stripline antenna device with bridges made from pieces of metal foil and capacitors.

FIG. 2B shows a plan view of a detail of the conductor of the stripline antenna device 20. The conductor tracks 31 depicted here to be designed parallel to one another, by way of example. In this case, the upper layer arrangement 36 constitutes the layer arrangement 36 facing the high frequency antenna device 20. The neighboring conductor tracks 31 of the upper layer arrangement 36 are interconnected via bridges 32, 33 conducting high frequency currents. Currents induced by the high frequency antenna device 20 in the upper layer arrangement 36 can flow between neighboring conductor tracks 31 via the bridges 32, 33. A portion of the bridges 32, 33 can be designed as metal foils 32 that electrically interconnect respectively neighboring conductor tracks 31. The electrical connections can be produced, for example, by soldering, spot welding or else by being pressed on. So that the currents induced by the gradient coil system 22 in the upper layer arrangement 36 do not encounter any closed current paths of a number of conductor tracks 31, two bridges 32, 33 are designed as capacitors 33, in particular ceramic capacitors. The dimensioning of the capacitors 33 is selected in such a way that the capacitors 33 offer a negligible impedance to the high frequency currents induced by the high frequency antenna 20, while the impedance for the currents induced by the gradient coil system 22 is very high. The arrangement illustrated in FIG. 2B of the bridges 32, 33 is intended merely as an illustration. When selecting the arrangement of the bridges 32, 33, it is to be ensured, in particular, that no ring currents induced by the gradient coil system 22 can flow via a number of conductor tracks 31, and also that no currents whose resonance frequency is in the region of the operating frequency of the magnetic resonance unit can flow. The lower layer arrangement 37 is not provided with bridges in the exemplary embodiment depicted. However, it is also conceivable for the conductor tracks 31 of the lower layer arrangement 37 likewise to be connected with the aid of bridges 32, 33 in accordance with the upper layer arrangement 36. For the sake of clarity, the dielectric 35 is not depicted in FIG. 2B. In a further exemplary embodiment (not illustrated further here), of the conductor of the stripline antenna device 20, the latter has only a single layer arrangement 36 provided with bridges 32, 33. The shielding and high frequency properties of this design do not quite reach the good shielding and high frequency properties of the design illustrated in FIGS. 2A and 2B. However, such a design is simple and can be produced cost effectively.

Figure 3:
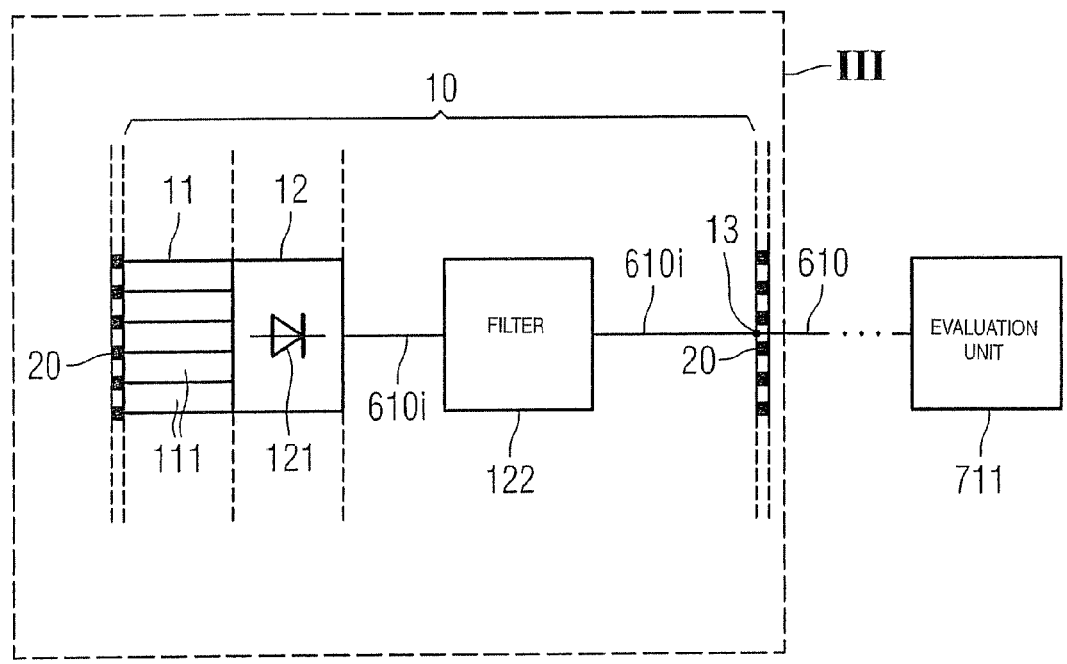
FIG. 3 is a detailed view of the combined PET/MRT unit in accordance with FIG. 1.

FIG. 3 illustrates the detail denoted by III in FIG. 1. The PET unit part 10 is connected in this case to the evaluation unit 711 via the connection 13 by the signal line 610. A gamma ray detector 11 is arranged with an associated electronics unit 12 inside the PET unit part 10. The PET unit part 10 is surrounded by a conductor of the stripline antenna device 20 (illustrated schematically here). The gamma ray detector 11 has a number of scintillation detectors 111 arranged next to one another. To provide protection against destruction by the relatively high field strengths that originate from the high frequency antenna device 20, the electronics unit 12 is provided with at least one protection diode 121. A signal line 610i connects the electronics unit 12 to the connection 13 of the PET unit part 10 via a filter 122, in particular via a bandpass filter or via a filter designed as a cascade of a high-pass filter and a notch filter. A corresponding filter 122 is also respectively provided in the case of the signal lines (not illustrated here) between the individual gamma ray detectors 11 with assigned electronics units 12 that interconnect the gamma ray detectors 11 with assigned electronics units 12.

Figure 4:
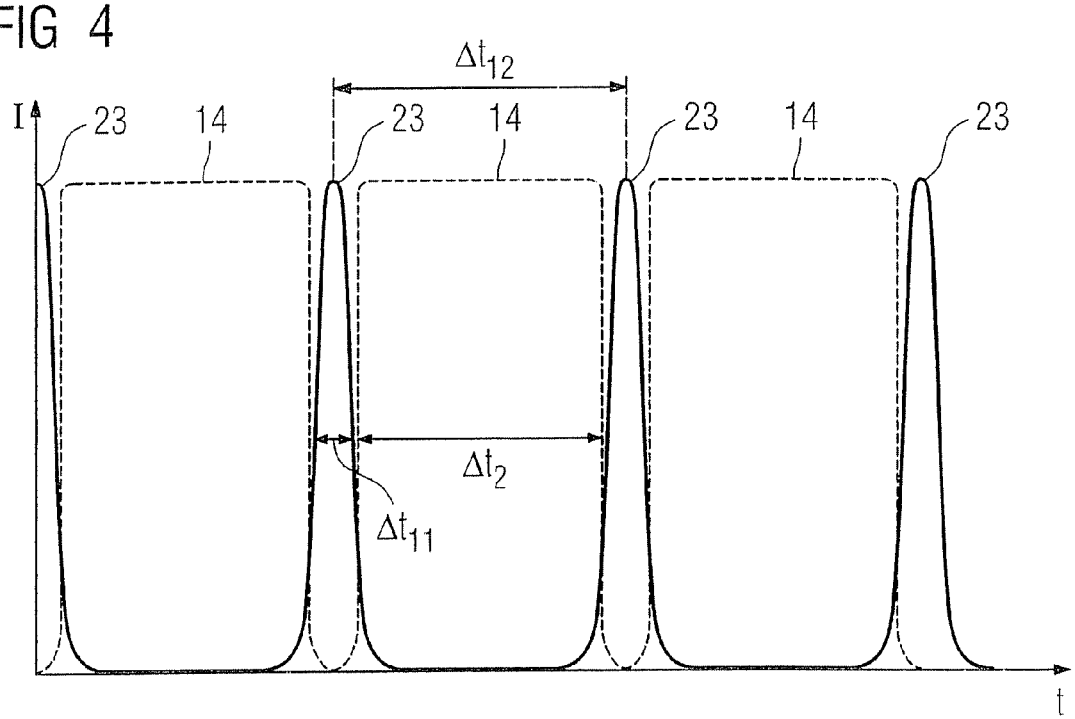
FIG. 4 is a schematic of the temporal sequence during operation of the combined PET/MRT unit for the combined PET/MRT imaging method.

FIG. 4 is a schematic of the temporal sequence during operation of the inventive PET/MRT unit for the combined PET/MRT imaging method. The abscissa forms the time axis t, while the ordinate represents the intensity I of the excitation pulse 23. The units are arbitrary. Also plotted in the diagram is a dashed line 14 that is intended to reproduce the operating state of the evaluation unit 711 assigned to the PET unit and, if appropriate, of the power supply unit 710 assigned to the PET unit part 10. The line 14 illustrates the time segments during which the evaluation unit 711 evaluates PET signals for a PET image and, if appropriate, the time segments during which the power supply unit 710 supplies the PET unit part 10, in particular the electronics unit 12, with energy. Throughout the pulse duration $\Delta t_{11}$ of an excitation pulse 23, the evaluation unit 711 does not evaluate PET signals, and the power supply unit 710 is, if appropriate switched off or switched to standby mode. Between two excitation pulses 23, which have a temporal spacing of $\Delta t_{12}$, the evaluation unit 711 is in the evaluation mode for the time period $\Delta t_2$, where $\Delta t_2 < \Delta t_{12}$, and the power supply unit 710 is switched on, the PET unit part 10, in particular the electronics unit 12, being supplied with energy. In accordance with FIG. 1, the evaluation unit 711 and, if appropriate, the power supply unit 710 are controlled as a function of the pulse sequence of the MRT unit by virtue of the fact that the evaluation unit 711 assigned to the PET unit part 10 and, if appropriate, the power supply unit 710 are controlled by the evaluation unit 80, which likewise controls the transceiver unit 720 assigned to the MRT unit.

Thus, a PET image and an MRT image can be recorded simultaneously with the aid of the combined PET/MRT imaging method. This combined recording lasts just as long as the recording of an MRT image on its own, since the period $\Delta t_{12}$ that is present in any case for the MRT imaging can be used between two excitation pulses 23 in order to record a PET image.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

What is claimed is:

1. A combined positron emission tomography and magnetic resonance tomography unit for imaging an examination object in an examination space, comprising a positron emission tomography unit having a unit part assigned to the examination space, the unit part comprising at least two gamma ray detector units with in each case an assigned electronics unit for detecting radiation emitted from the examination space of the examination object and converting the radiation into corresponding electric signals, and a first evaluation unit for evaluating the electric signals for a positron emission tomography image of the examination object; and a magnetic resonance tomography unit, including a high frequency antenna device for at least one of transmitting high frequency excitation pulses into the examination space and receiving, from the examination space, magnetic resonance signals from the examination object, the high frequency antenna device being formed as a stripline antenna device having at least two conductors, each conductor of the stripline antenna device respectively including a gamma ray detector unit with an assigned electronics unit for which the conductor forms a shielding cover opaque to high frequency radiation caused by the high frequency antenna device, a gradient coil system for generating magnetic gradient fields in the examination space, the high frequency antenna device being arranged nearer to the examination space than the gradient coil system, a high frequency shield arranged between the gradient coil system and the high frequency antenna device, for decoupling the high frequency antenna device from the gradient coil system, and a second evaluation unit for evaluating the magnetic resonance signals for a magnetic resonance tomography image of the examination object.

2. The combined positron emission tomography and magnetic resonance tomography unit as claimed in claim 1, wherein each conductor of the stripline antenna device comprises:

a first electrically conductive layer arrangement;

a second electrically conductive layer arrangement arranged opposite the first electrically conductive layer arrangement; and a dielectric separating the first and second electrically conductive layer arrangements, and wherein the first and second electrically conductive layer arrangements include conductor tracks arranged next to one another and separated by electrically insulating slots with the electrically insulating slots in the first electrically conductive layer arrangement offset from the electrically insulating slots in the second electrically conductive layer arrangement and neighboring conductor tracks are interconnected via bridges conducting high frequency currents.

3. The combined positron emission tomography and magnetic resonance tomography unit as claimed in claim 2, wherein at least a first portion of the bridges is formed by pieces of metal foil.

4. The combined positron emission tomography and magnetic resonance tomography unit as claimed in claim 3, wherein at least a second portion of the bridges is formed by capacitors.

5. The combined positron emission tomography and magnetic resonance tomography unit as claimed in claim 4, wherein the first evaluation unit is connected to each electronics unit of the positron emission tomography unit part via at least one signal line running inside and outside the positron emission tomography unit part, and wherein a part of each signal line that runs inside the positron emission tomography unit part is provided with a bandpass filter assigned to a corresponding electronics unit.

6. The combined positron emission tomography and magnetic resonance tomography unit as claimed in claim 4, wherein the first evaluation unit is connected to each electronics unit of the positron emission tomography unit part via at least one signal line running inside and outside the positron emission tomography unit part, and wherein a part of each signal line that runs inside the positron emission tomography unit part is provided with a filter assigned to the corresponding electronics unit, where the filter is one of a cascade filter, a high-pass filter and a notch filter.

7. The combined positron emission tomography and magnetic resonance tomography unit as claimed in claim 4, wherein all components of the positron emission tomography unit part are made from nonmagnetic material.

8. The combined positron emission tomography and magnetic resonance tomography unit as claimed in one of the preceding claims, wherein each electronics unit of the positron emission tomography unit part is provided with at least one protection diode to protect against destruction by the high frequency excitation pulses emitted by the high frequency antenna device of the magnetic resonance tomography unit.

9. A method for imaging an examination object in an examination space by a combined positron emission tomography and magnetic resonance tomography unit, including a positron emission tomography unit having a unit part assigned to the examination space that has at least two gamma ray detector units, each with an assigned electronics unit, and a first evaluation unit that evaluates the electric signals for a positron emission tomography image of the examination object, the gamma ray detector units detecting radiation emitted from the examination space by the examination object, each electronics unit converting the detected radiation into corresponding electric signals, and a magnetic resonance tomography unit having a high frequency antenna device at least one of transmitting excitation pulses into the examination space and receiving from the examination space magnetic resonance signals from the examination object, the high frequency antenna device being formed as a stripline antenna device with at least two conductors and a gradient coil system that generates magnetic gradient fields in the examination space, the high frequency antenna device being arranged nearer to the examination space than the gradient coil system and separated therefrom by a high frequency shield that decouples the high frequency antenna device from the gradient coil system, the magnetic resonance tomography unit also having a second evaluation unit that evaluates the magnetic resonance signals for a magnetic resonance tomography image of the examination object, said method comprising:

avoiding evaluation by the first evaluation unit of electric signals for a positron emission tomography image of the examination object at least for a duration of each excitation pulse emitted by the high frequency antenna device; and shielding, by each conductor of the stripline antenna device, a gamma ray detector unit with an assigned electronics unit, from high frequency radiation caused by the high frequency antenna device to which each conductor is opaque.

10. The method as claimed in claim 9, further comprising not supplying each electronics unit of the positron emission tomography unit part with energy for the duration of each excitation pulse emitted by the high frequency antenna device.

11. The method as claimed in claim 9, further comprising switching each electronics unit of the positron emission tomography unit part into a standby mode for the duration of each excitation pulse emitted by the high frequency antenna device.

* * * * *